United States Patent
Douglass

(10) Patent No.: US 6,961,919 B1
(45) Date of Patent: Nov. 1, 2005

(54) METHOD OF DESIGNING INTEGRATED CIRCUIT HAVING BOTH CONFIGURABLE AND FIXED LOGIC CIRCUITRY

(75) Inventor: Stephen M. Douglass, Saratoga, CA (US)

(73) Assignee: Xilinx, Inc., San Jose, CA (US)

(*) Notice: Subject to any disclaimer, the term of this patent is extended or adjusted under 35 U.S.C. 154(b) by 0 days.

(21) Appl. No.: 10/092,051

(22) Filed: Mar. 4, 2002

(51) Int. Cl.⁷ .................................. G06F 9/45
(52) U.S. Cl. .......................... 716/18; 716/17
(58) Field of Search ................ 716/1, 2, 16, 17, 716/8, 18, 7

(56) References Cited

U.S. PATENT DOCUMENTS

| | | | |
|---|---|---|---|
| 4,758,985 A | 7/1988 | Carter | |
| 4,855,669 A | 8/1989 | Mahoney | |
| 5,072,418 A | 12/1991 | Boutaud et al. | |

(Continued)

FOREIGN PATENT DOCUMENTS

| | | |
|---|---|---|
| EP | 0315275 A2 | 10/1989 |
| EP | 0 905 906 A2 | 3/1999 |
| EP | 1 235 351 A1 | 8/2002 |
| WO | WO 93 25968 A1 | 12/1993 |

OTHER PUBLICATIONS

Andrew, W.B., "A field prgrammable system chip which combines FPGA and ASIC circuitry", IEEE, May 1999, pp. 183–186.*

Wittig, R.D., "Onechip: an FPGA processor with reconfigurable logic", IEEE, Apr. 1996, pp. 126–135.*

(Continued)

*Primary Examiner*—Stacy A. Whitmore
(74) *Attorney, Agent, or Firm*—Garlick & Harrison; Kim Kanzaki

(57) ABSTRACT

A method for designing an integrated circuit having both fixed logic and programmable logic components. An intended set of applications for the integrated circuit is first identified. In addition, for each of the intended set of applications, the logic requirements are identified. An approximate number of configurable logic blocks and at least one fixed logic circuit are selected that, when combined to operate cooperatively, meet a substantial portion of the logic requirements and the logic functions of the intended set of applications. The method also involves designing the integrated circuit with the approximate number of configurable logic blocks arranged and interconnected to form a fabric that surrounds an opening, and inserting the at least one fixed logic circuit into the opening in the fabric. In addition, the method involves adding logic to the integrated circuit that interfaces the at least one fixed logic circuit to the fabric and input/output circuitry.

24 Claims, 11 Drawing Sheets

U.S. PATENT DOCUMENTS

| | | | |
|---|---|---|---|
| 5,142,625 A | | 8/1992 | Nakai |
| RE34,363 E | | 8/1993 | Freeman |
| 5,274,570 A | | 12/1993 | Izumi et al. |
| 5,311,114 A | | 5/1994 | Sambamurthy et al. |
| 5,339,262 A | * | 8/1994 | Rostoker et al. ............... 716/4 |
| 5,347,181 A | | 9/1994 | Ashby et al. |
| 5,361,373 A | | 11/1994 | Gilson |
| 5,457,410 A | * | 10/1995 | Ting ........................... 326/41 |
| 5,473,267 A | | 12/1995 | Stansfield |
| 5,500,943 A | | 3/1996 | Ho et al. |
| 5,504,738 A | | 4/1996 | Sambamurthy et al. |
| 5,537,601 A | | 7/1996 | Kimura et al. |
| 5,543,640 A | | 8/1996 | Sutherland et al. |
| 5,550,782 A | | 8/1996 | Cliff et al. |
| 5,552,722 A | | 9/1996 | Kean |
| 5,574,930 A | | 11/1996 | Halverson, Jr. et al. |
| 5,574,942 A | | 11/1996 | Colwell et al. |
| 5,581,745 A | | 12/1996 | Muraoka |
| 5,600,845 A | | 2/1997 | Gilson |
| 5,652,904 A | | 7/1997 | Trimberger |
| 5,671,355 A | | 9/1997 | Collins |
| 5,705,938 A | | 1/1998 | Kean |
| 5,732,250 A | | 3/1998 | Bates et al. |
| 5,737,631 A | | 4/1998 | Trimberger |
| 5,740,404 A | | 4/1998 | Baji |
| 5,742,179 A | | 4/1998 | Sasaki |
| 5,742,180 A | | 4/1998 | DeHon et al. |
| 5,748,979 A | | 5/1998 | Trimberger |
| 5,752,035 A | | 5/1998 | Trimberger |
| 5,760,607 A | | 6/1998 | Leeds et al. |
| 5,809,517 A | | 9/1998 | Shimura |
| 5,835,405 A | | 11/1998 | Tsui et al. |
| 5,874,834 A | | 2/1999 | New |
| 5,889,788 A | | 3/1999 | Pressly et al. |
| 5,892,961 A | | 4/1999 | Trimberger |
| 5,914,616 A | | 6/1999 | Young et al. |
| 5,914,902 A | | 6/1999 | Lawrence et al. |
| 5,933,023 A | | 8/1999 | Young |
| 5,970,254 A | | 10/1999 | Cooke et al. |
| 6,011,407 A | | 1/2000 | New |
| 6,020,755 A | | 2/2000 | Andrews et al. |
| 6,026,481 A | | 2/2000 | New et al. |
| 6,096,091 A | | 8/2000 | Hartmann |
| 6,154,051 A | | 11/2000 | Nguyen et al. |
| 6,163,166 A | | 12/2000 | Bielby et al. |
| 6,172,990 B1 | | 1/2001 | Deb et al. |
| 6,178,541 B1 | * | 1/2001 | Joly et al. ...................... 716/17 |
| 6,181,163 B1 | | 1/2001 | Agrawal et al. |
| 6,211,697 B1 | | 4/2001 | Lien et al. |
| 6,242,945 B1 | | 6/2001 | New |
| 6,272,451 B1 | | 8/2001 | Mason et al. |
| 6,279,045 B1 | | 8/2001 | Muthujumaraswathy et al. |
| 6,282,627 B1 | | 8/2001 | Wong et al. |
| 6,301,696 B1 | * | 10/2001 | Lien et al. .................... 716/16 |
| 6,343,207 B1 | | 1/2002 | Hessel et al. |
| 6,353,331 B1 | | 3/2002 | Shimanek |
| 6,356,987 B1 | | 3/2002 | Aulas |
| 6,389,558 B1 | | 5/2002 | Herrmann et al. |
| 6,434,735 B1 | | 8/2002 | Watkins |
| 6,460,172 B1 | | 10/2002 | Insenser Farre et al. |
| 6,467,009 B1 | | 10/2002 | Winegarden et al. |
| 6,483,342 B2 | | 11/2002 | Britton et al. |
| 6,507,942 B1 | | 1/2003 | Calderone et al. |
| 6,510,548 B1 | * | 1/2003 | Squires ........................ 716/16 |
| 6,518,787 B1 | | 2/2003 | Allegrucci et al. |
| 6,519,753 B1 | * | 2/2003 | Ang et al. .................... 716/16 |
| 6,522,167 B1 | | 2/2003 | Ansari et al. |
| 6,532,572 B1 | | 3/2003 | Tetelbaum |
| 6,539,508 B1 | | 3/2003 | Patrie et al. |
| 6,539,532 B1 | * | 3/2003 | Levi et al. .................... 716/16 |
| 6,541,991 B1 | | 4/2003 | Horncheck et al. |
| 6,578,174 B2 | | 6/2003 | Zizzo |
| 6,587,995 B1 | | 7/2003 | Duboc et al. |
| 6,588,006 B1 | | 7/2003 | Watkins |
| 6,601,227 B1 | | 7/2003 | Trimberger |
| 6,604,228 B1 | | 8/2003 | Patel et al. |
| 6,611,951 B1 | | 8/2003 | Tetelbaum et al. |
| 6,625,792 B1 | * | 9/2003 | Yamasaki ..................... 716/11 |
| 6,654,945 B1 | * | 11/2003 | Nakayama et al. ........... 716/18 |
| 6,654,946 B1 | * | 11/2003 | Eneboe et al. ................ 716/18 |
| 2001/0049813 A1 | | 12/2001 | Chan et al. |
| 2003/0062922 A1 | | 4/2003 | Douglass et al. |

OTHER PUBLICATIONS

Sayfe Kiaei et al., "VLSI Design of Dynamically Reconfigurable Array Processor–Drap, " IEEE, Feb. 1989, pp. 2484–2488, V3.6, IEEE, 3 Park Avenue, 17th Floor, New York, NY 10016–5997.

Vason P. Srini, "Field Programmable Gate Array (FPGA) Implementation of Digital Systems: An Alternative to ASIC," IEEE, May 1991, pp. 309–314, IEEE, 3 Park Avenue, 17th Floor, New York, NY 10016–5997.

G. Maki et al., "A Reconfigurable Data Path Processor," IEEE, Aug. 1991, pp. 18–4.1 to 18–4.4, IEEE, 3 Park Avenue, 17th Floor, New York, NY 10016–5997.

Jacob Davidson, "FPGA Implementation of Reconfigurable Microprocessor," IEEE, Mar. 1993, pp. 3.2.1–3.2.4, IEEE, 3 Park Avenue, 17th Floor, New York, NY 10016–5997.

Christian Iseli et al., "Beyond Superscaller Using FPGA's," IEEE, Apr. 1993, pp. 486–490, IEEE, 3 Park Avenue, 17th Floor, New York NY 10016–5997.

P.C. French et al., "A Self–Reconfiguring Processor,"; IEEE, Jul. 1993, pp. 50–59, IEEE, 3 Park Avenue, 17th Floor, New York, NY 10016–5997.

Christian Iseli et al., "Spyder: A Reconfigurable VLIW Processor Using FPGA's," IEEE, Jul 1993, pp. 17–24, IEEE, 3 Park Avenue, 17th Floor, New York, NY 10016–5997.

Michael I. Wirthlin et al., "The Nano Processor: A Low Resource Reconfigurable Processor," IEEE, Feb. 1994, pp. 23–30, IEEE, 3 Park Avenue, 17th Floor, New York, NY 10016–5997.

William S. Carter, "The Future of Programmable Logic and Its Impact on Digital System Design," Apr. 1994, IEEE, pp. 10–16, IEEE, 3 Park Avenue, 17th Floor, New York, NY 10016–5997.

Andre' Dehon, "DPGA–Coupled Microprocessors: Commodity ICs for the Early 21st Century, " IEEE, Feb. 1994, pp. 31–39, IEEE, 3 Park Avenue, 17th Floor, New York, NY 10016–5997.

Osama T. Albaharna, "Area & Time Limitations of FPGA-Based Virtual Hardware," IEEE, Apr. 1994, pp. 184–189, IEEE, 3 Park Avenue, 17th Floor, New York, NY 10016–5997.

U.S. Appl. No. 10/043,769, filed Jan. 9, 2002, Schulz.

U.S. Appl. No. 10/001,871, filed Nov. 19, 2001, Douglass et al.

U.S. Appl. No. 09/991,412, filed Nov. 16, 2001, Herron et al.

*Xilinx, Inc.*, "The Programmable Logic Data Book," 1994, Revised 1995, Xilinx, Inc., 2100 Logic Drive, San Jose, CA. 95124.

*Xilinx, Inc.*, "The Programmable Logic Data Book," 1994, Revised 1995, pp 2–109 to 2–117, Xilinx, Inc., 2100 Logic Drive, San Jose, CA. 95124.

*Xilinx, Inc.*, "The Programmable Logic Data Book," 1994, Revised 1995, pp 2–9 to 2–18; 2–187 to 2–199, Xilinx, Inc., 2100 Logic Drive, San Jose, CA. 95124.

*Xilinx, Inc.*, "The Programmable Logic Data Book," 1994, Revised 1995, pp 2–107 to 2–108, Xilinx, Inc., 2100 Logic Drive, San Jose, CA. 95124.

Christian Iseli et al., "AC++ Compiler for FPGA Custom Execution Units Synthesis," 1995, pp. 173–179, IEEE, 3 Park Avenue, 17th Floor, New York, NY 10016–5997.

*International Business Machines,* "PowerPC 405 Embedded Processor Core User Manual," 1996, 5th Ed., pp. 1–1 to X–16, International Business Machines, 1580 Rout 52, Bldg. 504, Hopewell Junction, NY 12533–6531.

Yamin Li et al., "AIZUP–A Pipelined Processor Design & Implementation on Xilinx FPGA Chip," IEEE, Sep. 1996, pp 98–106, IEEE, 3 Park Avenue, 17th Floor, New York, NY 10016–5997.

*Xilinx, Inc.*, "The Programmable Logic Data Book," Jan. 27, 1999, Ch. 3, pp 3–1 to 3–50, Xilinx, Inc., 2100 Logic Drive, San Jose, CA 95124.

*Xilinx, Inc.*, "The Programmable Logic Data Book," 2000, Ch. 3, pp 3–1 to 3–117, Xilinx, Inc., 2100 Logic Drive, San Jose, CA 95124.

*International Business Machines,* "Processor Local Bus" Architecture Specifications, 32–Bit Implementation, Apr. 2000, First Edition, V2.9, pp. 1–76, IBM Corporation, Department H83A, P.O. Box 12195, Research Triangle Park, NC 27709.

*Xilinx, Inc.*, Virtex II Platform FPGA Handbook, Dec. 6, 2000, v1.1, pp 33–75, Xilinx, Inc., 2100 Logic Drive, San Jose, CA. 95124.

U.S. Appl. No. 09/991,410, filed Nov. 16, 2001, Herron et al.

U.S. Appl. No. 09917,304, filed Jul. 27, 2001, Douglas et al.

U.S. Appl. No. 09/861,112, filed May 18, 2001, Dao et al.

U.S. Appl. No. 09/858,732, filed May 15, 2001, Schulz.

*Xilinx, Inc.*, "The Programmable Logic Data Book," 2000, Ch 3, pp 3–7 to 3–17; 3–76 to 3–87, Xilinx, Inc., 2100 Logic Drive, San Jose, CA. 95124.

U.S. Appl. No. 09/968,446, filed Sep. 28, 2001, Douglass et al.

Cary D. Snyder and Max Baron; "Xilinx's A–to–Z System Platform"; Cahners Microprocessor; The Insider's Guide to Microprocessor Hardware; Microdesign Resources; Feb. 6, 2001; pp. 1–5.

* cited by examiner

METHOD OF DESIGNING INTEGRATED CIRCUIT HAVING BOTH CONFIGURABLE AND FIXED LOGIC CIRCUITRY

BACKGROUND

1. Technical Field

The invention relates generally to the design of integrated circuits; and, more particularly, it relates to the design of integrated circuits having both fixed logic and programmable logic components.

2. Related Art

Programmable devices are a class of general-purpose integrated circuits that can be configured for a wide variety of applications. Such programmable devices have two basic versions, mask programmable devices, which are programmed only by a manufacture, and field programmable devices, which are programmable by the end user. In addition, programmable devices can be further categorized as programmable memory devices or programmable logic devices. Programmable memory devices include programmable read only memory (PROM), erasable programmable read only memory (EPROM) and electronically erasable programmable read only memory (EEPROM). Programmable logic devices include programmable logic array (PLA) devices, programmable array logic (PAL) devices, erasable programmable logic devices (EPLD) devices, and programmable gate arrays (PGA).

As is known, field programmable gate arrays (FPGAs) allow an end user to create a customize logic design via programming and to freely change the design by reprogramming the design while avoiding the initial cost, time delay and inherent risk of application specific integrated circuits (ASICs). While FPGAs have these advantages, there are some disadvantages. For instance, an FPGA programmed to perform a similar function as implemented in an ASIC requires approximately 25 to 50 times more die area than the ASIC. As such, the manufacturing expense of an FPGA is greater than that of an ASIC. In addition, an FPGA requires significantly more printed circuit board space and consumes more power than an equally functional ASIC.

To mitigate some of the disadvantages of FPGAs with respect to ASICs, some FPGA manufacturers are including ASIC like functions on the same substrate as the programmable logic fabric. For example, FPGAs are now commercially available that include random access memory (RAM) blocks and/or multipliers in the programmable logic fabric. As such, the programmable logic fabric does not have to be programmed to perform RAM functions and/or multiplier functions, when such functions are needed. Thus, for these functions, significantly less die area is needed within the FPGA.

While included such fixed logic functions in the programmable logic fabric offers end users greater programming options with less die area consumption, end users are demanding greater FPGA performance and flexibility from FPGAs. In particular, end users would like to see more fixed logic functionality, (i.e., ASIC like functionality) embedded within the programmable logic fabric of FPGAs, while retaining the versatility of traditional FPGAs.

Given the relative newness of providing fixed logic functionality within a programmable logic fabric of an FPGA, there is very little known in the art, if anything at all, concerning the appropriate combination of these two, oftentimes, diametrically opposed technologies. That is to say, the fixed logic functionality is geared towards and based in one particular direction of development, and the technology of programmable logic fabric is directed in another direction entirely. The integration of these two circuit types has left many in the art with very little direction on how to perform and to provide this combination of elements as desired by end users.

Thus, there is a need in the art for a methodology of overcoming these and other difficulties in the design of integrated circuits having both fixed logic and programmable logic components.

SUMMARY OF THE INVENTION

In order to overcome the above referenced difficulties in integrated circuit design, as well as other shortcomings of prior integrated circuit design techniques, a method of designing an integrated circuit according to the present invention efficiently combines fixed logic and programmable logic components into an integrated circuit. This method includes first determining the logic requirements for an intended set of applications for the integrated circuit. These logic requirements may include any one or combination of data processing requirements, data storage requirements, data throughput requirements, instruction set type, instruction set contents, and other logic requirements. Next, the method includes determining at least one common logic function for the intended set of applications for the integrated circuit. Then, an approximate number of configurable logic blocks and at least one fixed logic circuit are determined that, when combined to operate cooperatively, meet a substantial portion of the logic requirements for the intended set of applications for the integrated circuit. The integrated circuit is designed to include the approximate number of configurable logic blocks formed as a fabric and arranged to surround an opening in the fabric. With this design, the integrated circuit includes the at least one fixed logic circuit in the opening in the fabric and interconnecting logic that interfaces the at least one fixed logic circuit to the fabric.

The method may include selecting a die size for the integrated circuit, and designing the integrated circuit such that the configurable logic blocks and the at least one fixed logic circuit fit within a targeted die size. The method may also involve selecting a process for manufacturing of the integrated circuit such that the process involves a minimum dimension size for the integrated circuit, and selecting a die size for the integrated circuit considering the process, the approximate number of configurable logic blocks, and the at least one fixed logic circuit. The at least one fixed logic circuit may be selected from the group of digital signal processors, microprocessors, physical layer interfaces, link layer interfaces, network layer interfaces, audio processors, video graphics processors, and applications specific integrated circuits, among other circuits. The intended applications may include any one or combination applications including, but not limited to, communications applications, system-on-a-chip applications, image-processing applications, parallel processing applications, networking applications, and prototyping applications. The integrated circuit may occupy a die area, and the fixed logic circuit is appropriately selected to occupy less than a predetermined percentage of the die area.

The method of the present invention also includes aspects relating to input and output requirements. With this method, an intended set of applications for the integrated circuit is first identified. Then, for each of the intended set of applications, logic requirements and input/output requirements are identified. Next, an approximate number of configurable logic blocks and at least one fixed logic input/output circuit are identified that, when combined to operate cooperatively, meet a substantial portion of the logic requirements and the input/output requirements of the intended set of applications. The integrated circuit is then designed to include the approximate number of configurable logic blocks arranged and interconnected to form a fabric that at least partially surrounds an opening. Contained within this opening is the at least one fixed logic input/output circuit in the opening in the fabric. The integrated circuit also includes interconnecting logic that interfaces the at least one fixed logic input/output circuit to the fabric. In other particular embodiments, the fabric is formed to include a plurality of openings. Formed within each of this plurality of openings is a fixed logic circuit.

This method may also include selecting a die size for the integrated circuit and designing the integrated circuit such that the configurable logic blocks and the at least one fixed logic input/output circuit fit within a targeted die size. Further, the method may include selecting a process for manufacturing of the integrated circuit, wherein the process involves a minimum dimension size for the integrated circuit and selecting a die size for the integrated circuit considering the process, the approximate number of configurable logic blocks and the at least one fixed logic input/output circuit. Also, the one fixed logic input/output circuit may be selected from the group consisting of high speed serial input/output circuits and high speed parallel input/output circuits. In such case, the input/output requirements are characterized by parameters including at least one of bit rate input, bit rate output, data width, address width, and parallel bus frequency. The intended applications may include communications applications, system-on-a-chip applications, image-processing applications, parallel processing applications, networking applications, and prototyping applications.

The above-referenced description of the summary of the invention captures some, but not all, of the various aspect of the present invention. The claims are directed to some other of the various other embodiments of the subject matter towards which the present invention is directed. In addition, other aspects, advantages and novel features of the invention will become apparent from the following detailed description of the invention when considered in conjunction with the accompanying drawings.

BRIEF DESCRIPTION OF THE DRAWINGS

A better understanding of the invention can be obtained when the following detailed description of various exemplary embodiments is considered in conjunction with the following drawings.

DETAILED DESCRIPTION OF THE INVENTION

Figure 1:
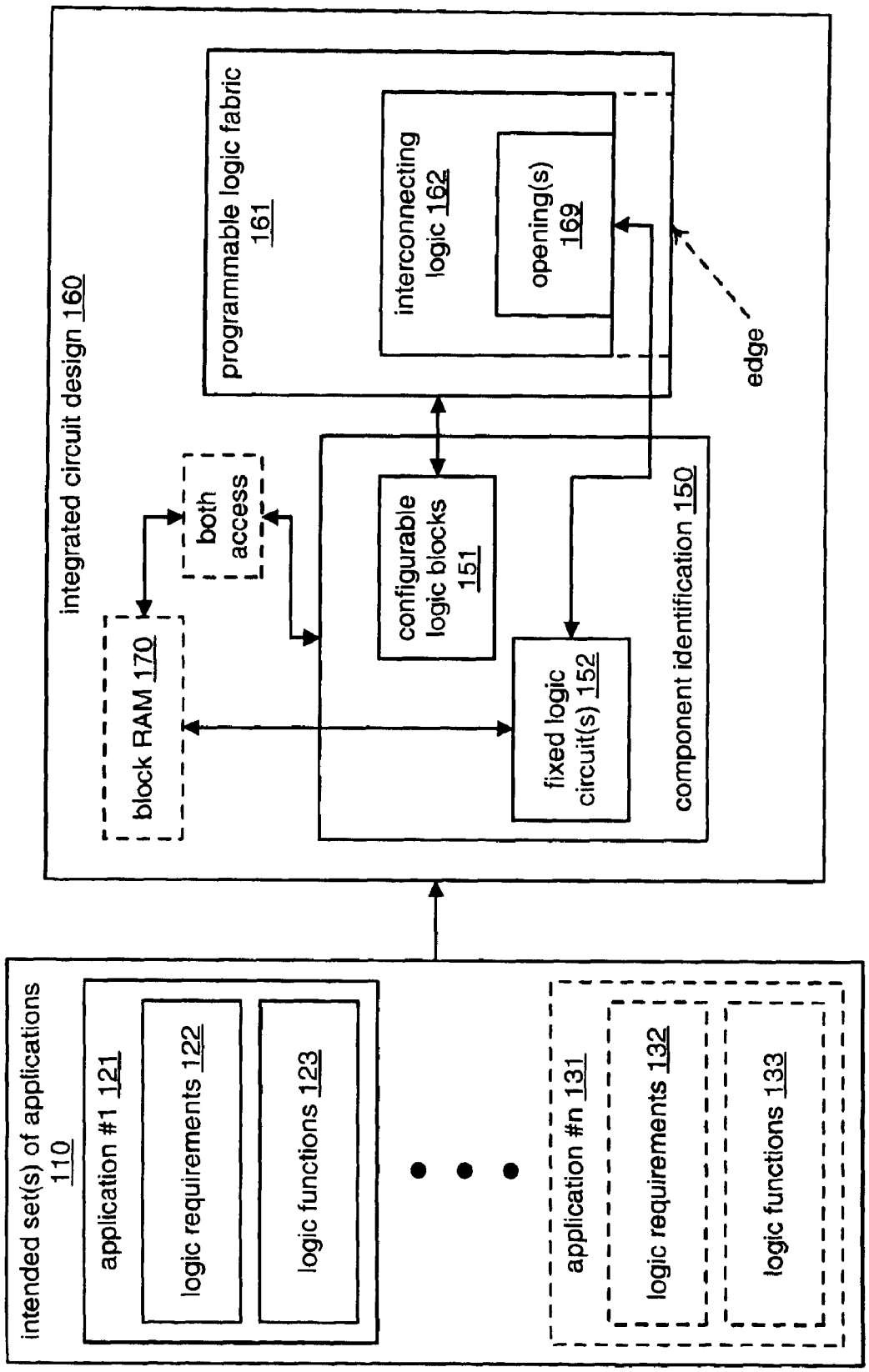
FIG. 1 is a system diagram illustrating an embodiment of method for designing an integrated circuit by considering one or more intended sets of application in accordance with the present invention.

FIG. 1 is a system diagram illustrating an embodiment of method for designing an integrated circuit 100 by considering one or more intended sets of application in accordance with the present invention. A number of intended set(s) of applications 110 are identified and used to influence an integrated circuit design 160. The intended set(s) of applications 110 includes as few as one intended set(s) of applications and may include any number of intended set(s) of applications. The intended set(s) of applications 110 may be categorized as targeting a number of applications, as shown by an application #1 121, . . . , and an application #n 131. If desired, each of the applications are further categorized as having logic requirements and logic functions. For example, the application #1 121 is shown as having logic requirements 122 and logic functions 123. Similarly, the application #n 131 is shown as having logic requirements 132 and logic functions 133.

The integrated circuit design 160 involves performing component identification 150 to identify a number of configurable logic blocks 151 and any number (as few as one) of fixed logic circuit(s) 152 that in combination satisfy the logic requirements of a substantial number of the applications. Either and/or both of the configurable logic blocks 151 and the fixed logic circuit(s) 152 may be operable to access and communicate with other functional blocks in the design 160, such as RAM 170. The configurable logic blocks 151 are used to generate and constitute a programmable logic fabric 161. The fixed logic circuit(s) 152 are placed inside of any number (as few as one) of opening(s) 169. The number of opening(s) 169 will typically correspond to the number of fixed logic circuit(s) 152, but there may be embodiments where more than one of the fixed logic circuit(s) 152 is placed within a single one of the opening(s) 169 thereby creating a situation where the two do not match up against one another on a one-to-one basis. In addition, interconnecting logic 162 is used to surround, at least in part or substantially surround, the fixed logic circuit(s) 152. The interconnecting logic 162 interconnects the fixed logic circuit(s) 152 and the programmable logic fabric 161. In embodiments where the fixed logic circuit(s) 152 is placed near an edge of the programmable logic fabric 161, the interconnecting logic 162 surrounds only a portion of the fixed logic circuit(s) 152. However, in embodiments in which the fixed logic circuit(s) 152 is a microprocessor, for example, the interconnecting logic 162 may fully surround the fixed logic circuit(s) 152.

Figure 2:
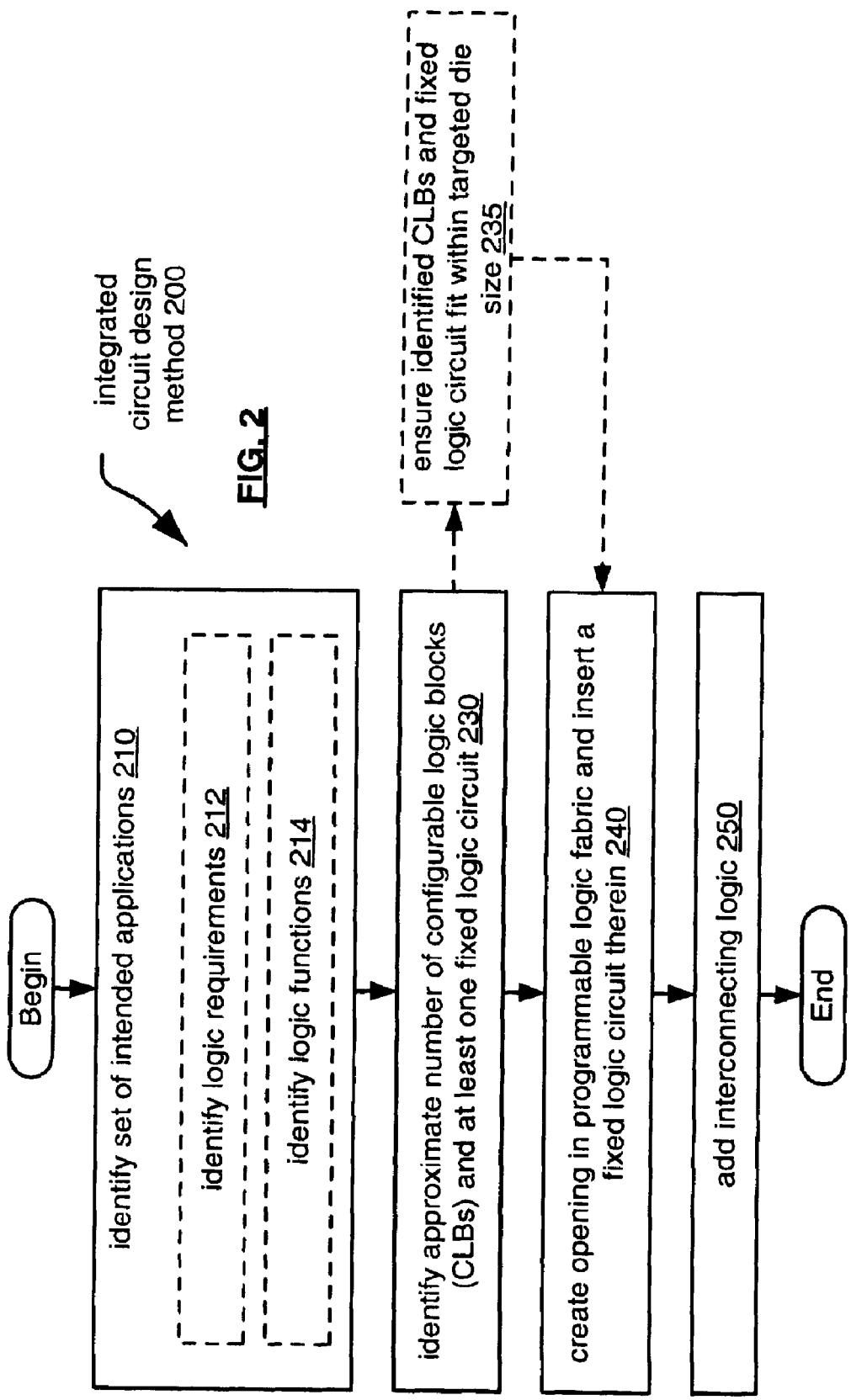
FIG. 2 is a logic diagram illustrating an embodiment of an integrated circuit design method performed in accordance with the present invention.

FIG. 2 is a logic diagram illustrating an embodiment of an integrated circuit design method 200 performed in accordance with the present invention. In a block 210, a number of intended sets of applications are identified. The identification includes identification of logic requirements 212 and logic functions 214. Then, in a block 230, an approximate number of configurable logic blocks (CLBs) and at least one fixed logic circuit are identified. Then, in a block 240, an opening is created in a programmable logic fabric, and the fixed logic circuit is inserted therein. Ultimately, in a block 250, interconnecting logic is added to the integrated circuit to ensure proper interfacing between the fixed logic circuit and the programmable logic fabric.

In alternative embodiments, the identified configurable logic blocks and the identified at least one fixed logic circuit are appropriately chosen to ensure that they fit within a targeted die size of the integrated circuit, as shown in an alternative block 235.

Figure 3:
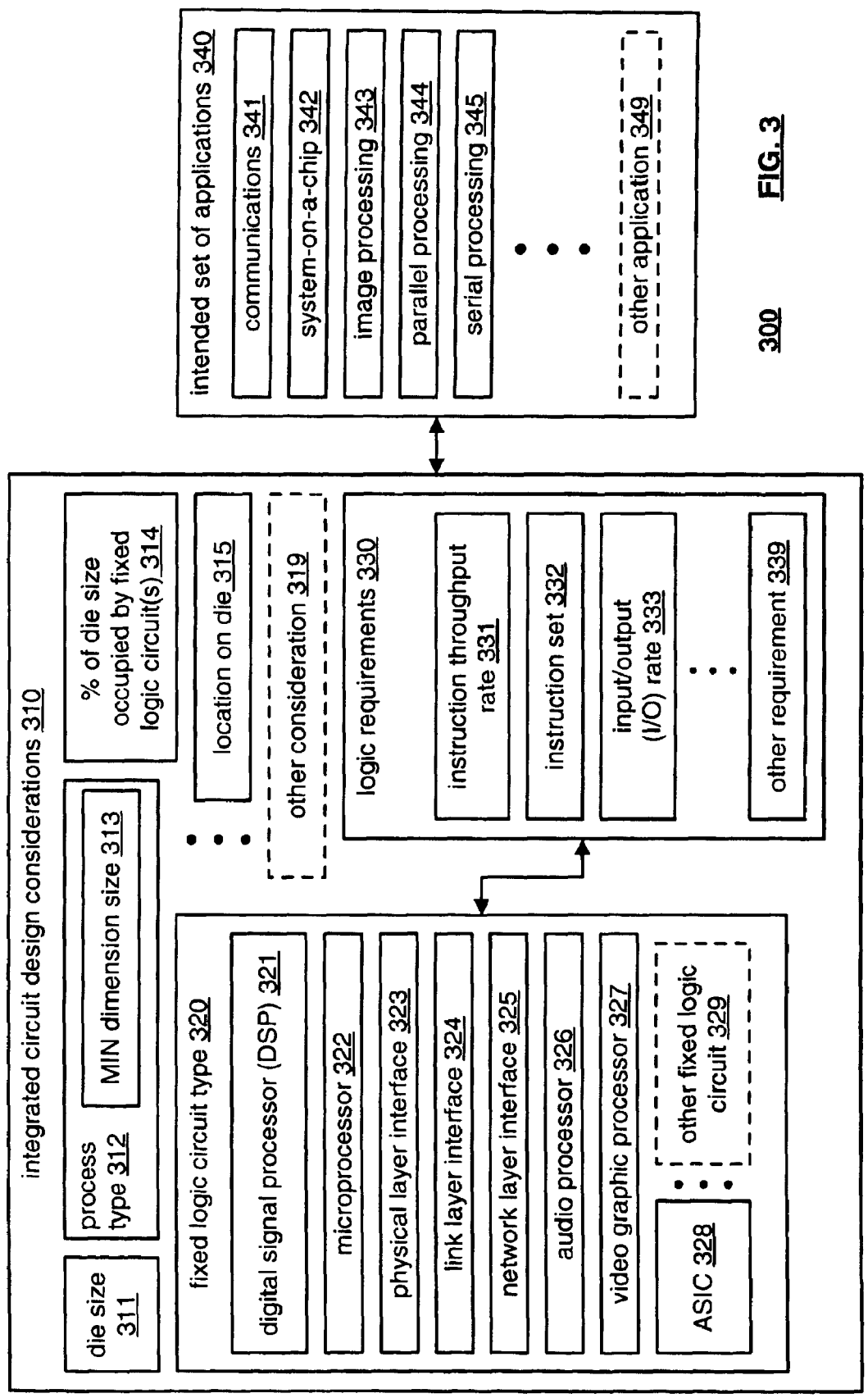
FIG. 3 is a system diagram illustrating an embodiment of method for designing an integrated circuit involving a number of integrated circuit design considerations in accordance with the present invention.

FIG. 3 is a system diagram illustrating an embodiment of a method for designing an integrated circuit 300 involving a number of integrated circuit design considerations 310 in accordance with the present invention. The number of integrated circuit design considerations 310 are used to direct and govern the design of an integrated circuit to meet an intended set of applications 340. The integrated circuit design considerations 310 include dies size 311, process type 312 (that also offers a minimum dimension size 313 for transistor level circuitry and other circuitry), a percentage of a targeted die size that is occupied by fixed logic circuit(s) 314, location of integrated circuit components on the die 315, and other considerations 319.

Integrated circuit design considerations 310 also include the logic requirements 330 that must be served by the integrated circuit. The logic requirements 330 are at least partially serviced by one or more fixed logic circuits and a plurality of configurable logic blocks formed into a fabric. All of the integrated circuit design considerations are considered to design an integrated circuit that services one or more of an intended set of applications 340. The intended set of applications 340 may include, for example, communications applications 341, system-on-a-chip applications 342, image processing applications 343, parallel processing applications 344, serial processing applications 345, prototyping applications 346, . . . , among other applications 349.

A fixed logic circuit selected from the fixed logic circuit type(s) 320, in combination with the plurality of configurable logic blocks, services the logic requirements 330 and are selected and interconnected in the design of the integrated circuit. The fixed logic circuit types 320 includes none, one, or more than one of a digital signal processor (DSP) 321, a microprocessor 322, a physical layer interface 323, a link layer interface 324, a network layer interface 325, an audio processor 326, a video graphics processor 327, and an application specific integrated circuit (ASIC) 328, . . . , and any other fixed logic circuits 329. The logic requirements 330 may be characterized by any number of logic requirements including instruction throughput rate 331, instruction set 332, input/output rate 333, data processing rates (not shown), . . . , and other logic requirements 339.

Figure 4:
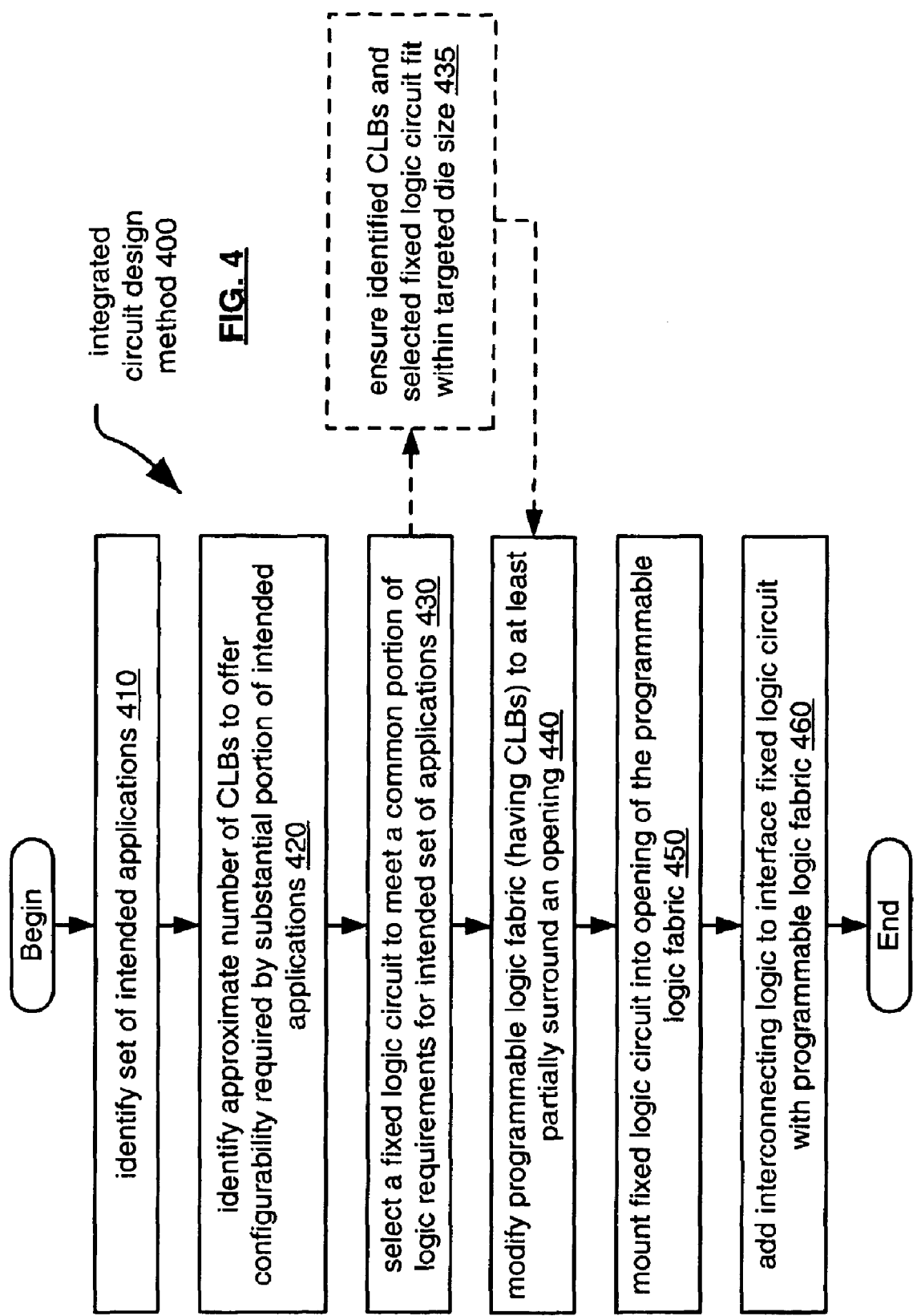
FIG. 4 is a logic diagram illustrating another embodiment of an integrated circuit design method performed in accordance with the present invention.

FIG. 4 is a logic diagram illustrating another embodiment of an integrated circuit design method 400 performed in accordance with the present invention. In a block 410, a number of intended sets of applications are identified. The identification may include identification of logic requirements and logic functions as well. Then, in a block 420, an approximate number of configurable logic blocks (CLBs) are identified to offer the programmability required by a substantial portion of the intended sets of application. In a block 430, at least one fixed logic circuit is identified to meet a common portion of the logic requirements of the intended sets of applications. Then, in a block 440, a programmable logic fabric, having the number of configurable logic blocks (CLBs), is formed as a fabric that at least partially surrounds an opening. Then, in a block 450, the fixed logic circuit is mounted into the opening of the programmable logic fabric. Ultimately, in a block 460, interconnecting logic is added to the integrated circuit to ensure proper interfacing between the fixed logic circuit and the programmable logic fabric. In alternative embodiments, the identified configurable logic blocks (CLBs) and the identified at least one fixed logic circuit are appropriately chosen to ensure that they fit within a targeted die size of the integrated circuit, as shown in an alternative block 435.

Figure 5:
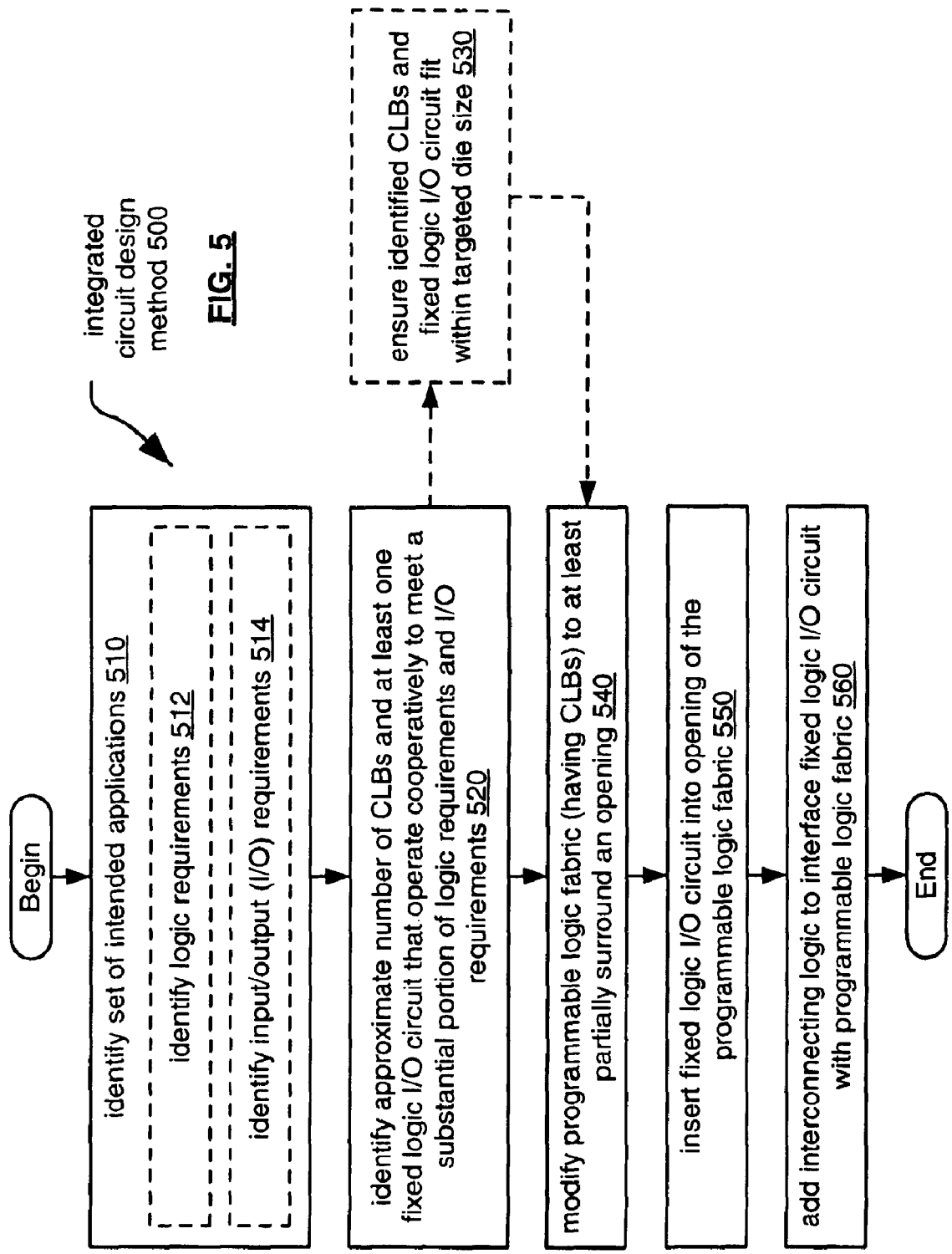
FIG. 5 is a logic diagram illustrating another embodiment of an integrated circuit design method performed in accordance with the present invention.

FIG. 5 is a logic diagram illustrating another embodiment of an integrated circuit design method 500 performed in accordance with the present invention. In a block 510, a number of intended sets of applications are identified. The identification may include identification of logic requirements 512 and input/output requirements 514 as well. Then, in a block 520, an approximate number of configurable logic blocks (CLBs) and at least one fixed logic input/output circuit are identified to operate cooperatively to meet a substantial portion of the logic requirements and the input/output requirements.

Then, in a block 540, a programmable logic fabric, having a number of configurable logic blocks (CLBs), is modified to at least partially surround an opening. Then, in a block 550, the fixed logic input/output circuit is mounted into the opening of the programmable logic fabric. Ultimately, in a block 560, interconnecting logic is added to the integrated circuit to ensure proper interfacing between the fixed logic input/output circuit and the programmable logic fabric. In alternative embodiments, the identified configurable logic blocks (CLBs) and the identified at least one fixed logic input/output circuit are appropriately chosen to ensure that they fit within a targeted die size of the integrated circuit, as shown in an alternative block 535.

Figure 6:
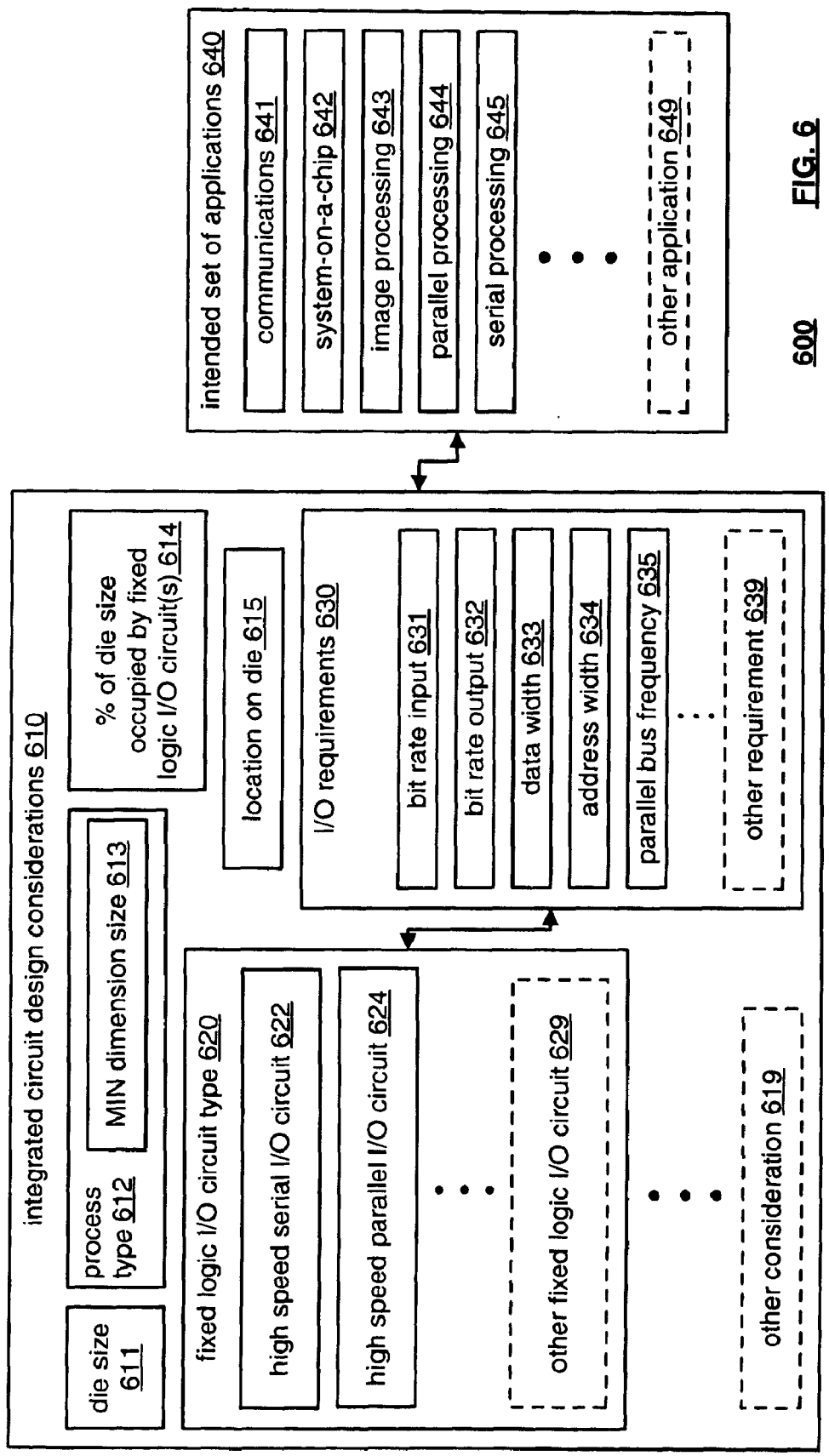
FIG. 6 is a system diagram illustrating another embodiment of method for designing an integrated circuit involving a number of integrated circuit design considerations in accordance with the present invention.

FIG. 6 is a system diagram illustrating another embodiment of method for designing an integrated circuit 600 involving a number of integrated circuit design considerations 610 in accordance with the present invention. The number of integrated circuit design considerations 610 are used to design an integrated circuit that services all or a portion of an intended sets of applications 640. The intended set of applications 640 may include communications applications 641, system-on-a-chip applications 642, image processing applications 643, parallel processing applications 644, serial processing applications 645, prototyping applications (not shown), among other applications 649.

The particular aspect of the present invention described with reference to FIG. 6 relates to input/output requirements. The input/output requirements of the integrated circuit design are typically considered in addition to other design requirements, i.e., logic requirements. These input/output requirements 630 may include bit rate input 631, bit rate output 632, address width 633, data width 634, parallel bus frequency 635, . . . , and/or any other input/output requirements 639. Additional design considerations 610 of FIG. 6 include die size 611, a process type 612 (that may also consider a minimum dimension size 613 for transistor level circuitry), a percentage of a targeted die size that may be occupied by fixed logic input/output circuit(s) 614, circuit component die locations 615, and/or other considerations 619.

In order to service the input/output requirements of the integrated circuit, one or more fixed logic input/output circuits are included in the design of the integrated circuit. The fixed logic input/output circuit(s) 620 may include one or more of a high speed serial input/output circuit 621, a high speed parallel input/output circuit 622, . . . , and/or another fixed logic input/output circuit 629. The fixed logic I/O circuit is selected to service a substantial portion of the input/output requirements of the integrated circuit in a manner that is more efficient, or that cannot be performed using the configurable logic of the integrated circuit.

The fixed logic input/output circuit is designed into the integrated circuit so that it resides within an opening of a fabric formed by configurable logic blocks of the integrated circuit. This opening may be formed so that one or more sides of the opening reside on an edge of the integrated circuit. Alternately, the opening may be formed so that it is fully surrounded by the fabric. In either case, the fixed logic input/output circuit resides at least in part within the opening of the fabric. Interconnecting logic interconnects the fixed logic input/output circuit to the fabric. In some embodiments, the fixed logic input/output circuit resides partially in the input/output ring surrounding the FPGA fabric.

Figure 7:
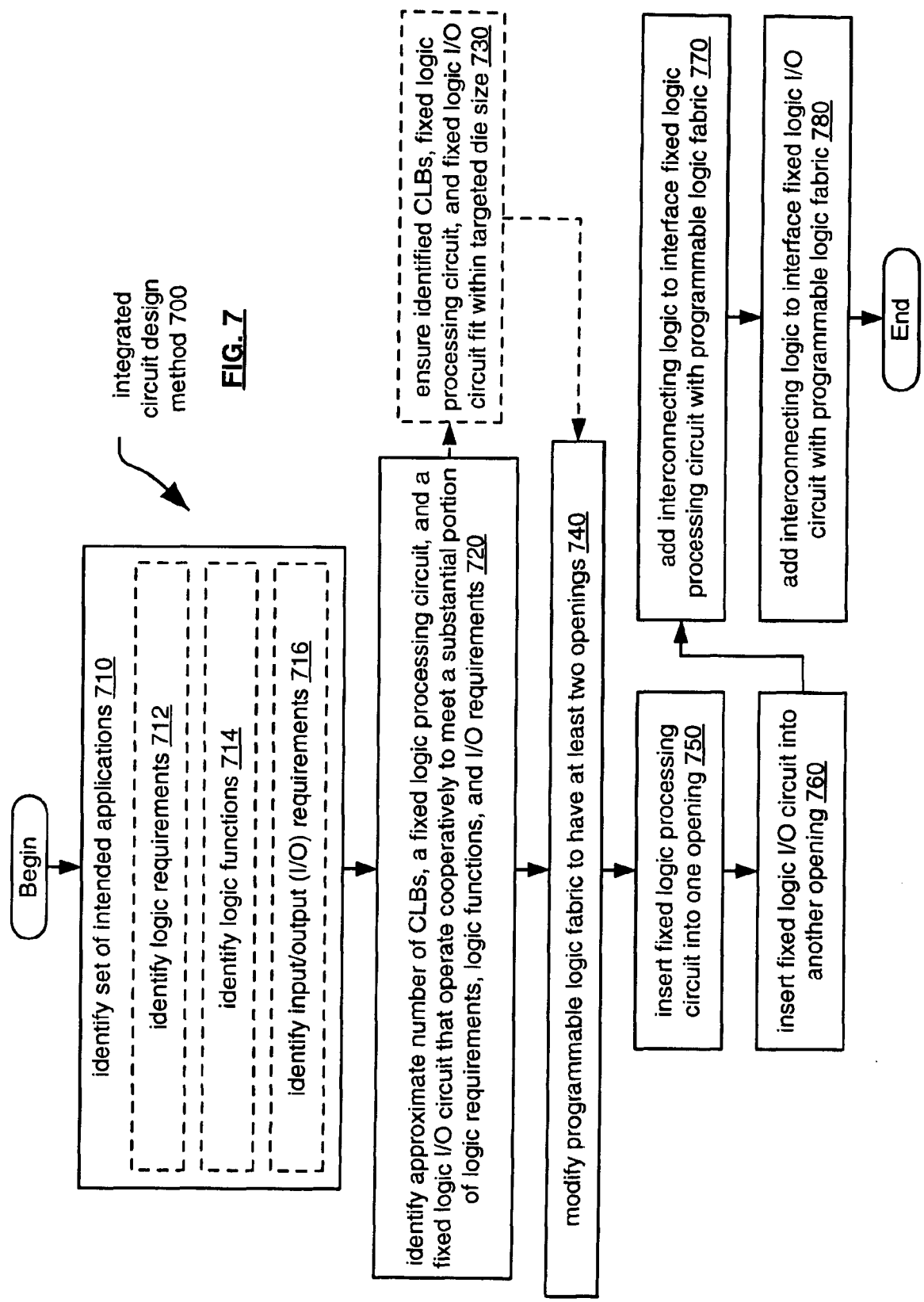
FIG. 7 is a logic diagram illustrating another embodiment of an integrated circuit design method performed in accordance with the present invention.

FIG. 7 is a logic diagram illustrating another embodiment of an integrated circuit design method 700 performed in accordance with the present invention. In a block 710, a number of intended sets of applications are identified. The identification may include identification of logic requirements 712, logic functions 714, and input/output requirements 716 for each of the intended set of applications as well.

Then, in a block 720, an approximate number of configurable logic blocks (CLBs), at least one fixed logic circuit, and at least one fixed logic input/output circuit are identified to operate cooperatively to meet a substantial portion of the logic requirements and the fixed logic input/output requirements identified at step 710. The fixed logic processing circuit selected at step 720 is based upon one or more logic functions that are substantially common across the intended set of applications that were identified at step 710.

Then, a block 740, a programmable logic fabric, having a number of configurable logic blocks (CLBs), is modified to include at least two openings. In a block 750, the fixed logic processing circuit is mounted into one or more of the openings of the programmable logic fabric. Then, in a block 760, the fixed logic input/output circuit is mounted into one or more of the other openings of the programmable logic fabric. Then, in block 760, interconnecting logic is added to the integrated circuit to ensure proper interfacing between the fixed logic circuit(s) and fixed logic I/O circuit(s), and the programmable logic fabric. Finally, at block 770, interconnecting logic is added to the integrated circuit to ensure proper interfacing between the fixed logic input/output circuit and the programmable logic fabric. Optionally, the identified configurable logic blocks (CLBs), the identified fixed logic processing circuit, and the identified fixed logic input/output circuit are appropriately chosen to ensure that they fit within a targeted die size of the integrated circuit, as shown in an alternative block 735.

Figure 8:
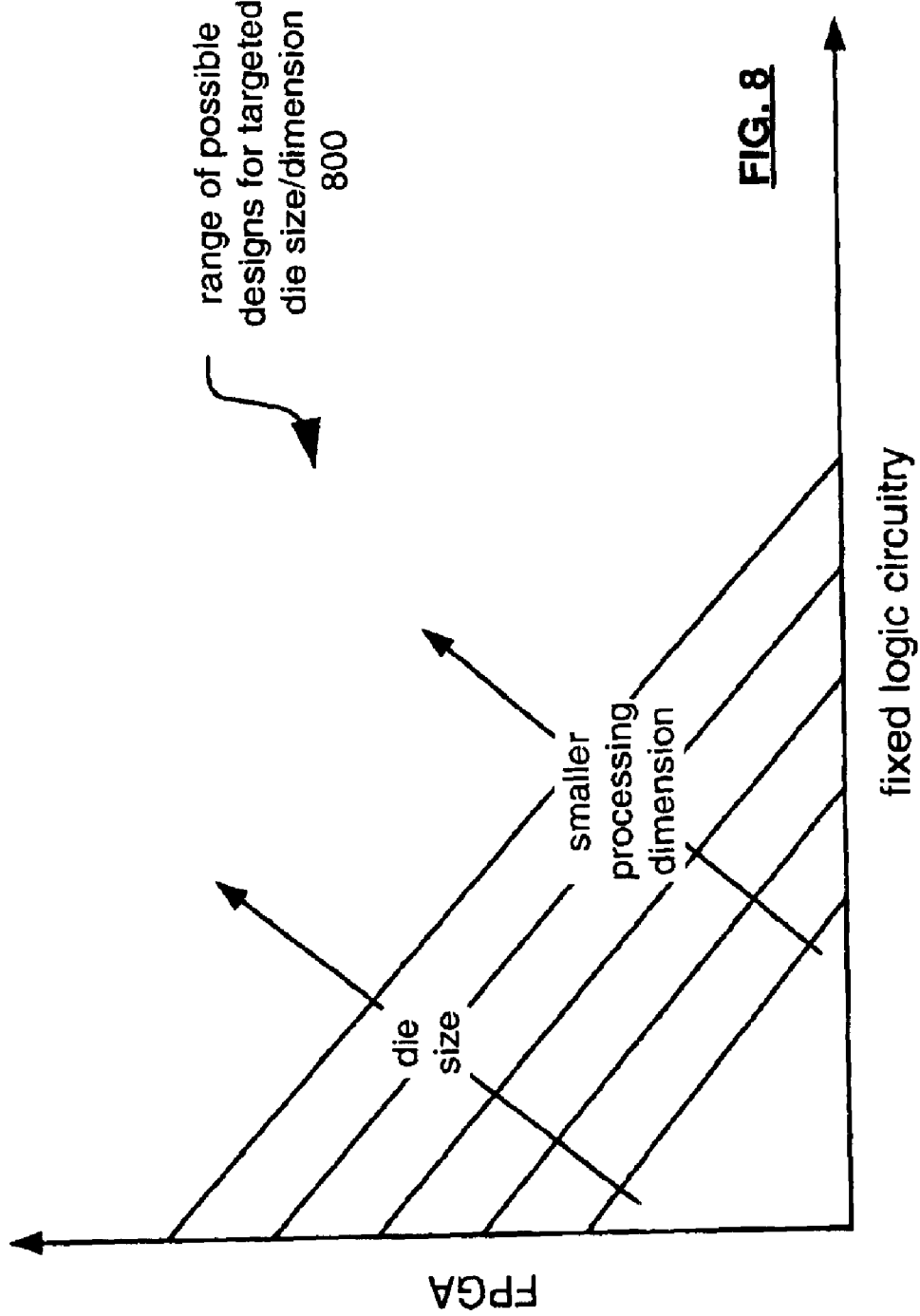
FIG. 8 is a graphical illustration considering the possible ranges of an integrated circuit design incorporating both fixed logic circuitry and FPGA circuitry in accordance with the present invention.

FIG. 8 is a graphical illustration considering the possible ranges of an integrated circuit design incorporating both fixed logic circuitry and FPGA circuitry in accordance with the present invention. FPGA capacity/size/performance is represented on the vertical axis of the graph while fixed logic circuit capacity/size/performance is shown along the horizontal axis of the graph. Given lines that extend from the horizontal to the vertical axis represent die size/processing dimension combinations. For each of these lines, a maximum FPGA circuit capacity is represented at the intersection of the line with the vertical axis. Likewise, maximum fixed logic circuit capacity is represented at the intersection of the same line at the intersection of the line with the horizontal axis. Thus, for each die size/processing dimension combination, a corresponding integrated circuit can contain a combination of FPGA blocks and fixed logic circuit(s), the combination of which may not extend past a respective die size/processing dimension line.

As is evident, the configurability of the FPGA and the advantages offered by fixed logic circuitry are intimately coupled to one another. As the number of blocks within an FPGA array increases, for a given die size/processing dimension combination, then the total number of fixed logic circuits (or capability of the fixed logic circuits) decreases. Similarly, the converse is true; as the total number of fixed logic circuits (or their total capability) increases, for a given die size/processing dimension combination, then the total number of blocks within an FPGA array that may be employed in the integrated circuit decreases.

These two design considerations also trend closely to one another in terms of die size and smaller processing dimension as shown in the FIG. 8. FIG. 8 generally shows the relationship between the configurability offered by an FPGA array as it is tied to the incorporation of embedded fixed logic circuits, and it is not intended to be a direct or exact mapping. Those having skill in the art will recognize how the two design parameters are critically coupled to one another.

Figure 9:
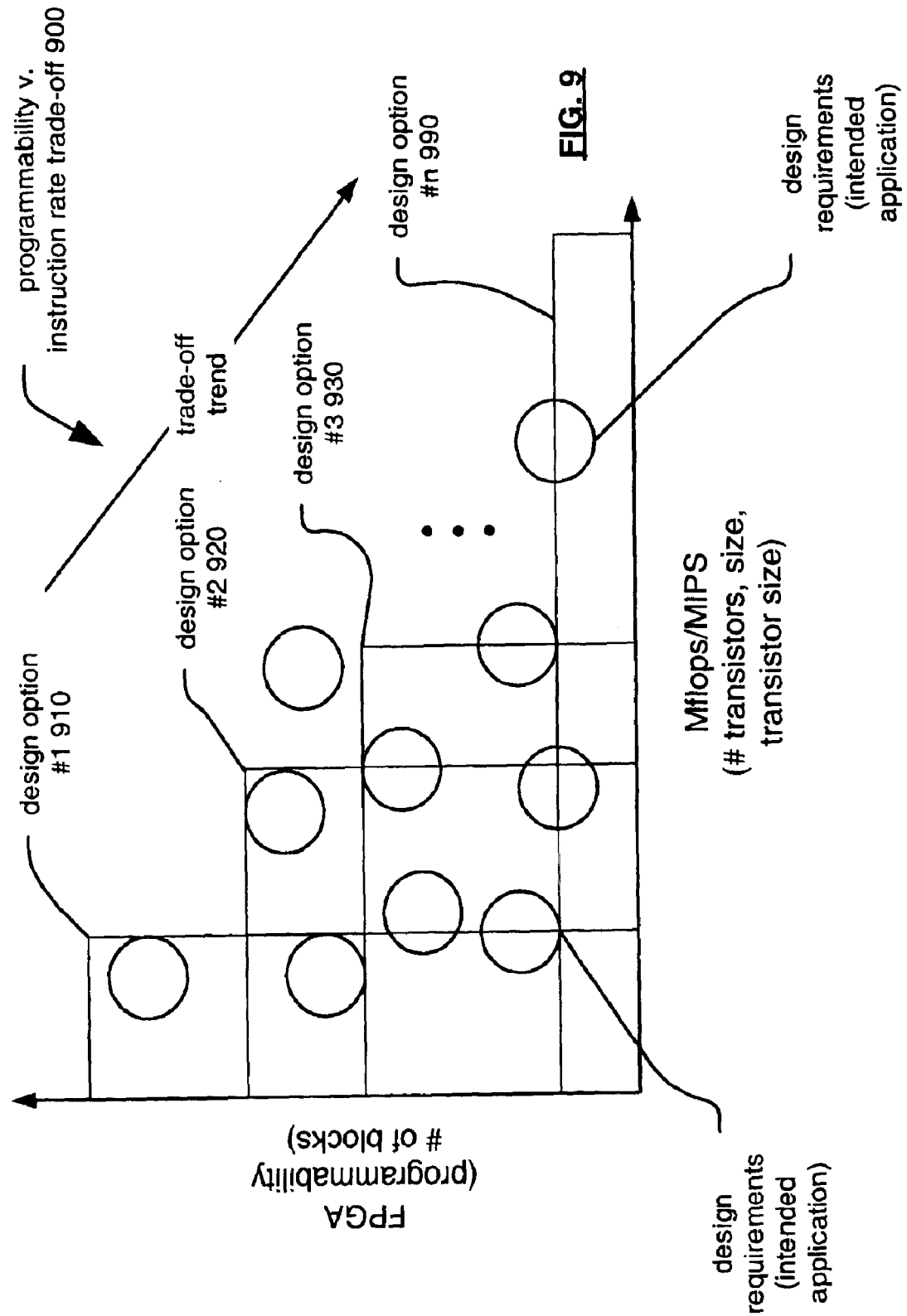
FIG. 9 is a graphical illustration of programmability versus instruction rate trade-off within integrated circuits incorporating both fixed logic circuitry and FPGA circuitry in accordance with the present invention.

FIG. 9 is a graphical illustration of programmability versus instruction rate trade-off 900 within integrated circuits incorporating both fixed logic circuitry and FPGA circuitry in accordance with the present invention. The concepts described with reference to FIG. 9 consider only one type of tradeoff considered when placing fixed logic circuitry within an FPGA fabric. Other considerations may also be characterized in a similar fashion. FPGA capacity/size/performance is represented on the vertical axis of the graph while fixed logic circuit capacity/size/performance is shown along the horizontal axis of the graph. The fixed logic circuit performance is characterized in FIG. 9 as instruction processing capability, e.g., Mflops, MIPs, etc. The performance of the fixed logic circuit directly relates to the number of transistors and/or size of the fixed logic circuit and inversely relates to the transistor size (minimum feature dimension) of the fixed logic circuit.

The configurability of the integrated circuit (# of FPGA blocks) and the fixed logic instruction processing performance of the integrated circuit are closely related. As the number of blocks within an FPGA array increases, for a given die size and processing method, then the total number of instructions that may be performed per unit time (or within a given die area of an integrated circuit) by a fixed logic circuit embedded therein is appropriately limited. Similarly, the converse is true; as the total number of instructions that may be performed per unit time (or within a given real estate area of an integrated circuit) by the fixed logic circuit is increased, for a given die size and processing method, then the total number of blocks within an FPGA array that may be employed is also appropriately limited. These two design considerations also trend closely to one another in terms of dies size and smaller processing dimension.

Integrated circuit design options for particular die size/process dimension combinations provide particular combinations of FPGA configurability and instruction processing performance. Lines that intersect the vertical and horizontal axes and that include both vertical and horizontal lines represent available design options. Each of these design options has maximum FPGA programmability and maximum fixed logic circuit capacity. For example, design option #1 910 includes relatively high FPGA configurability and relatively low instruction rate performance. Design option #2 920 represents a hybrid design option that includes somewhat lower FPGA configurability and somewhat higher instruction rate performance. Design option #3 930 includes an even lower FPGA configurability but a much higher instruction rate performance. This is just one example of the tradeoffs made when placing fixed logic circuits within a FPGA array.

The design options of FIG. 9 may be directly compared to the FPGA configurability and instruction rate processing requirements of various intended applications. The requirements of these intended applications are therefore compared to the capabilities of the design options of FIG. 9. For each intended application, if the requirements of the application reside within design option performance parameters, the design option may be selected to service the intended application.

Figure 10:
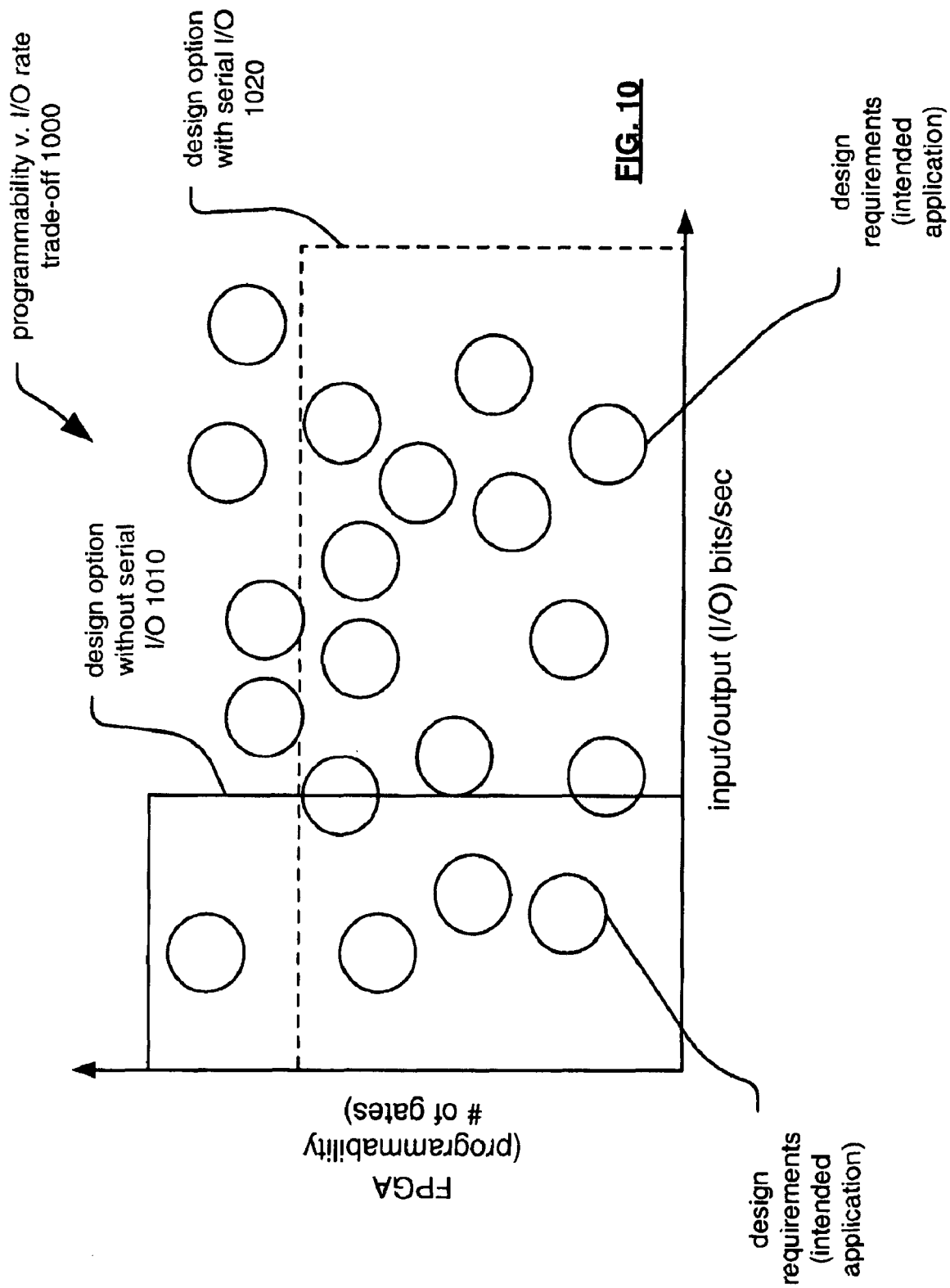
FIG. 10 is a graphical illustration of programmability versus input/output (I/O) rate trade-off of an integrated circuit incorporating both fixed logic input/output circuitry and FPGA circuitry in accordance with the present invention.

FIG. 10 is a graphical illustration of programmability versus input/output (I/O) rate trade-off 1000 of an integrated circuit incorporating both fixed logic input/output circuitry and FPGA circuitry in accordance with the present invention. The size/performance of the FPGA is shown along the vertical axis of the graph, and the input/output (I/O) rate is shown along the horizontal axis of the graph.

The configurability of the FPGA and the advantages offered by devices having very fast input/output rates are intimately coupled to one another. As the number of blocks within an FPGA array increases, for a given die size and processing method, then the rate of input/output that may be performed is appropriately limited. Similarly, the converse is true; as the rate of input/output is increased, for a given die size and processing method, then the total number of blocks within an FPGA array that may be employed is also appropriately limited. These two design considerations also trend closely to one another in terms of dies size and smaller processing dimension.

FIG. 10 illustrates design options for two separate designs, design 1010 having relatively greater FPGA configurability and lesser input/output capacity and design 1020 having relatively lesser FPGA configurability and greater input/output capacity. Various design requirements (corresponding to intended applications of the integrated circuit) are shown as circles within the FIG. 10. As is shown, each of the particular design options meets a certain number of the design requirements. For example, a design without serial input/output 1010 captures primarily those design option requirements that include relatively high FPGA configurability and relatively low input/output rate requirements. However, a design with serial input/output 1020 represents a design solution that offers lesser FPGA configurability and relatively greater input/output rate requirements.

In general, the trade-off trend is clear, in that, those design options that offer higher input/output rate capabilities (without having serial input/output capabilities) generally offer lower FPGA configurability; the converse is also true: those design options that offer higher FPGA configurability generally also offer lower input/output rate capabilities (that is, if the design does not have serial input/output capabilities).

Figure 11:
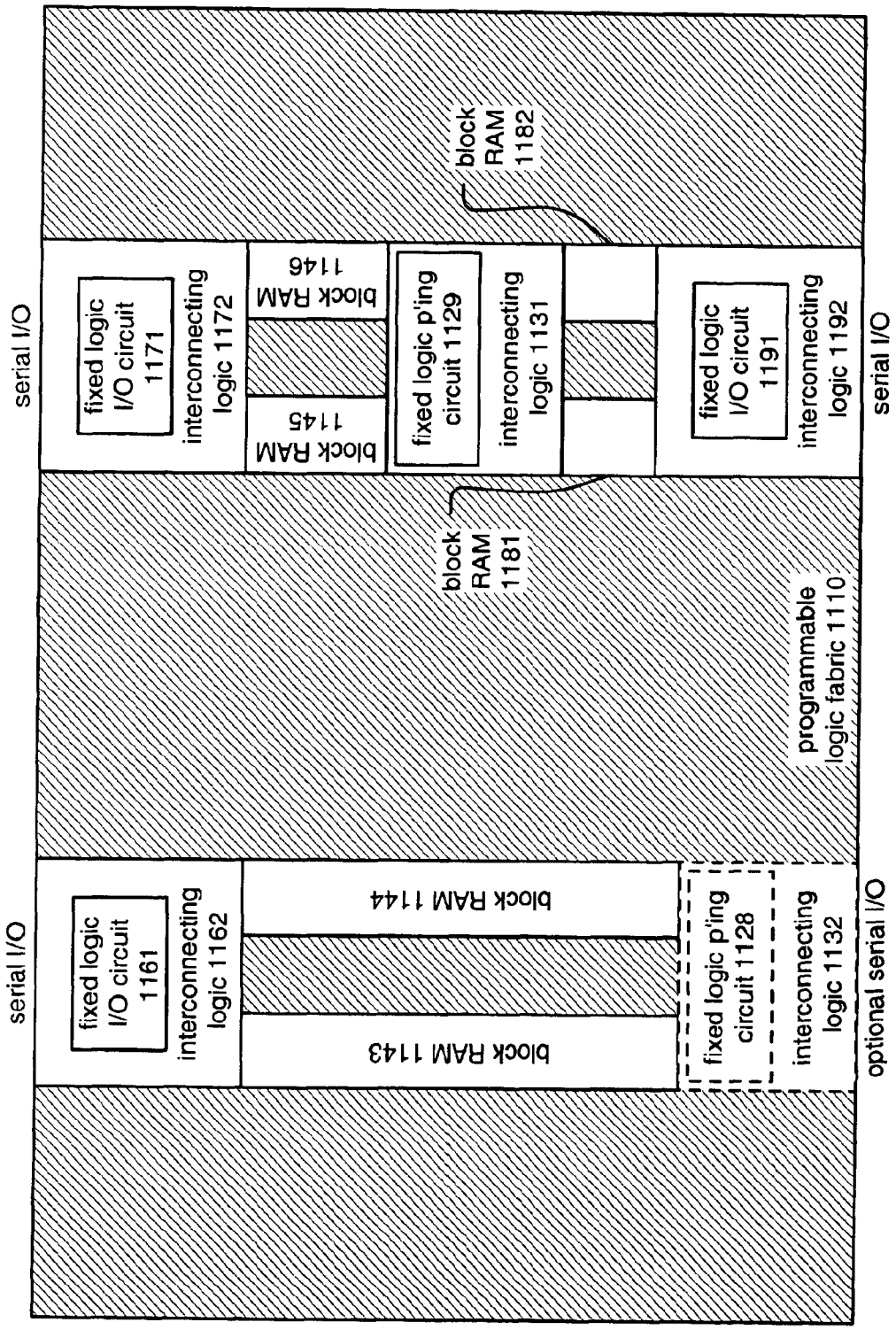
FIG. 11 is a system diagram illustrating an embodiment of an integrated circuit, having both fixed logic input/output circuitry and fixed logic processing circuitry that is built in accordance the present invention.

FIG. 11 is a system diagram illustrating an embodiment of an integrated circuit 1100, having both fixed logic input/output circuitry and fixed logic processing circuitry that is built in accordance the present invention. FIG. 11 provides just one example of an integrated circuit designed according to the present invention. Of course, many various other structures may be formed using the techniques of the present invention. The integrated circuit 1100 includes a programmable logic fabric 1110. The integrated circuit 1100 also includes three different fixed logic input/output (I/O) circuits, shown as fixed logic input/output (I/O) circuit 1161, fixed logic IU input/output (I/O) circuit 1171, and fixed logic input/output (I/O) circuit 1191. In addition, the integrated circuit 1100 include one fixed logic processing circuit 1129 and one optional fixed logic processing circuit 1128. Each of the various fixed logic input/output (I/O) circuits 1161, 1171, and 1191 and the fixed logic processing circuits 1129 and 1128 are surrounded by interconnecting logic. Specifically, the fixed logic input/output (I/O) circuit 1161 is surrounded by the interconnecting logic 1162; the fixed logic input/output (I/O) circuit 1171 is surrounded by the interconnecting logic 1172; and the fixed logic input/output (I/O) circuit 1191 is surrounded by the interconnecting logic 1192. Similarly, the fixed logic processing circuit 1129 is surrounded by the interconnecting logic 1131; and the optional fixed logic processing circuit 1128 is surrounded by the optional interconnecting logic 1132.

Interconnecting logic 1162 interconnects the fixed logic input/output (I/O) circuit 1161 and the programmable logic fabric 1110. Interconnecting logic 1172 interconnects fixed logic input/output (I/O) circuit 1171 with the programmable logic fabric 1110, with serial (or parallel) input/output provided near the top right hand side of the FIG. 11, and also with block RAMs 1145 and 1146 located below the fixed logic input/output (I/O) circuit 1171. Interconnecting logic 1192 interconnects fixed logic input/output (I/O) circuit 1191 with the programmable logic fabric 1110, with serial input/output provided near the lower right hand side of the FIG. 11, and with block RAMs 1181 and 1182 located above the fixed logic input/output (I/O) circuit 1191.

Interconnecting logic 1131 interconnects the fixed logic processing circuit 1128 with the programmable logic fabric 1110, and with block RAMs 1145, 1146, 1181, and 1182. Optional interconnecting logic 1132 interconnects the optional fixed logic processing circuit 1128 with the programmable logic fabric 1110, with block RAMs 1143 and 1144, and with optional serial input/output provided near the bottom left hand side of the FIG. 11.

In view of the above detailed description of the invention and associated drawings, other modifications and variations will now become apparent to those skilled in the art. It should also be apparent that such other modifications and variations may be effected without departing from the spirit and scope of the invention.

What is claimed is:

1. A method for designing an integrated circuit, the method comprising:
   determining logic requirements for an intended set of applications for the integrated circuit;
   determining at least one common logic function for the intended set of applications for the integrated circuit;
   identifying an approximate number of configurable logic blocks and at least one fixed logic circuit that, when combined to operate cooperatively, meet a substantial portion of the logic requirements for the intended set of applications for the integrated circuit;
   designing the integrated circuit to include the approximate number of configurable logic blocks formed as a fabric and arranged to surround an opening in the fabric;
   designing the integrated circuit to include the at least one fixed logic circuit in the opening in the fabric; and
   designing the integrated circuit to include interconnecting logic that interfaces the at least one fixed logic circuit to the fabric;
   selecting a process for manufacturing of the integrated circuit, wherein the process involves a minimum dimension size for the integrated circuit; and
   selecting a die size for the integrated circuit considering the process, the approximate number of configurable logic blocks and the at least one fixed logic circuit.

2. The method of claim 1, wherein the at least one fixed logic circuit is selected from the group consisting of digital signal processors, microprocessors, physical layer interfaces, link layer interfaces, network layer interfaces, audio processors, video graphics processors, and applications specific integrated circuits.

3. The method of claim 1, wherein the intended applications include at least one of communications applications, system-on-a-chip applications, image processing applications, parallel processing applications, networking applications, serial processing applications, and prototyping applications.

4. The method of claim 1, wherein the logic requirements are characterized by parameters including at least one of data processing requirements, data storage requirements, data throughput requirements, instruction set type, and instruction set contents.

5. The method of claim 1, wherein:
   the integrated circuit occupies a die area; and
   the fixed logic circuit occupies less than a predetermined percentage of the die area.

6. A method for designing an integrated circuit, the method comprising:
   identifying an intended set of applications for the integrated circuit;
   determining logic requirements for the intended set of applications for the integrated circuit;
   determining at least one common logic function for the intended set of applications for the integrated circuit;
   identifying an approximate number of configurable logic blocks that meets the programmable logic requirements of a substantial portion of the intended set of applications;
   selecting a fixed logic circuit that is operable to meet the at least one common logic function for the intended set of applications for the integrated circuit;
   designing the integrated circuit to include the fixed logic circuit and a fabric formed of the approximate number of configurable logic blocks, wherein the fixed logic circuit and the fabric operate cooperatively to substantially meet the logic requirements of the intended set of applications for the integrated circuit;
   designing the integrated circuit to include interconnecting logic that interfaces the fixed logic circuit to the fabric;
   selecting a process for manufacturing of the integrated circuit, wherein the process involves a minimum dimension size for the integrated circuit; and
   selecting a die size for the integrated circuit considering the process, the approximate number of configurable logic blocks and the fixed logic circuit.

7. The method of claim 6, wherein the fixed logic circuit is selected from the group consisting of digital signal processors, microprocessors, physical layer interfaces, link layer interfaces, network layer interfaces, audio processors, video graphics processors, and applications specific integrated circuits.

8. The method of claim 6, wherein the intended applications include at least one of communications applications, system-on-a-chip applications, image processing applications, parallel processing applications, networking applications, serial processing applications, and prototyping applications.

9. The method of claim 6, wherein the logic requirements are characterized by parameters including at least one of data processing requirements, data storage requirements, data throughput requirements, instruction set type, and instruction set contents.

10. The method of claim 6, wherein:
    the integrated circuit occupies a die area; and
    the fixed logic circuit occupies less than a predetermined percentage of the die area.

11. A method for designing an integrated circuit, the method comprising:
    identifying an intended set of applications for the integrated circuit;
    for each of the intended set of applications, identifying logic requirements;
    for each of the intended set of applications, identifying input/output requirements;
    identifying an approximate number of configurable logic blocks and at least one fixed logic input/output circuit that, when combined to operate cooperatively, meet a substantial portion of the logic requirements and the input/output requirements of the intended set of applications;
    designing the integrated circuit with the approximate number of configurable logic blocks arranged and interconnected to form a fabric that at least partially surrounds an opening;
    designing the integrated circuit to include the at least one fixed logic input/output circuit in the opening in the fabric;
    designing the integrated circuit to include interconnecting logic that interfaces the at least one fixed logic input/output circuit to the fabric;
    selecting a die size for the integrated circuit; and
    designing the integrated circuit such that the configurable logic blocks and the at least one fixed logic input/output circuit fit within a targeted die size.

12. The method of claim 11, wherein the at least one fixed logic input/output circuit is selected from the group consisting of high speed serial input/output circuits and high speed parallel input/output circuits.

13. The method of claim 11, wherein the intended applications include at least one of communications applications, system-on-a-chip applications, image processing applications, parallel processing applications, networking applications, and prototyping applications.

14. The method of claim 11, wherein the input/output requirements are characterized by parameters including at least one of bit rate input, bit rate output, data width, address width, parallel bus frequency.

15. The method of claim 11, wherein:
the integrated circuit occupies a die area; and
the at least one fixed logic input/output circuit occupies less than a predetermined percentage of the die area.

16. The method of claim 11, wherein the at least one fixed logic input/output circuit resides at an edge of the fabric.

17. A method for designing an integrated circuit, the method comprising:
identifying an intended set of applications for the integrated circuit;
determining logic requirements for the intended set of applications for the integrated circuit;
determining at least one common logic function for the intended set of applications for the integrated circuit;
selecting a fixed logic circuit that is operable to meet the at least one common logic function for the intended set of applications for the integrated circuit;
identifying input/output requirements for the intended set of applications for the integrated circuit;
identifying a fixed logic input/output circuit that meets a substantial portion of the input/output requirements for the intended set of applications for the integrated circuit;
identifying an approximate number of configurable logic blocks that, in combination with the fixed logic circuit and the fixed logic input/output circuit, substantially meets the logic requirements for the intended set of applications for the integrated circuit;
designing the integrated circuit to include the approximate number of configurable logic blocks, the fixed logic circuit, and the fixed logic input/output circuit;
selecting a die size for the integrated circuit; and
designing the integrated circuit such that the approximate number of configurable logic blocks, the fixed logic circuit, and the fixed logic input/output circuit fit within a targeted die size.

18. The method of claim 17, wherein the fixed logic input/output circuit is selected from the group consisting of high speed serial input/output circuits and high speed parallel input/output circuits.

19. The method of claim 17, wherein the intended applications include at least one of communications applications, system-on-a-chip applications, image processing applications, parallel processing applications, networking applications, serial processing applications, and prototyping applications.

20. The method of claim 17, wherein logic requirements are characterized by parameters including at least one of data processing requirements, data storage requirements, data throughput requirements, instruction set type, and instruction set contents.

21. The method of claim 17, wherein the input/output requirements are characterized by parameters including at least one of bit rate input, bit rate output, data width, address width, parallel bus frequency.

22. The method of claim 17, wherein:
the integrated circuit occupies a die area; and
the fixed logic input/output circuit occupies less than a predetermined percentage of the die area.

23. The method of claim 17, wherein the fixed logic input/output circuit resides at an edge of the fabric.

24. The method of claim 17, wherein the fixed logic input/output circuit and the fixed logic processing circuit access common block ram segments.

* * * * *